United States Patent
Forbes

(10) Patent No.: US 7,095,075 B2
(45) Date of Patent: Aug. 22, 2006

(54) APPARATUS AND METHOD FOR SPLIT TRANSISTOR MEMORY HAVING IMPROVED ENDURANCE

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/612,725

(22) Filed: Jul. 1, 2003

(65) Prior Publication Data

US 2005/0001229 A1    Jan. 6, 2005

(51) Int. Cl.
*H01L 29/76*    (2006.01)
*H01L 29/788*    (2006.01)

(52) U.S. Cl. .............. 257/317; 257/314; 257/315; 257/316

(58) Field of Classification Search ........ 257/314–326; 438/259
See application file for complete search history.

(56) References Cited

U.S. PATENT DOCUMENTS

| | | | |
|---|---|---|---|
| 4,184,207 A | 1/1980 | McElroy | |
| 4,420,504 A | 12/1983 | Cooper | |
| 4,558,344 A | 12/1985 | Perlegos | |
| 4,630,085 A * | 12/1986 | Koyama | 257/315 |
| 4,755,864 A | 7/1988 | Ariizumi | |
| 4,774,556 A | 9/1988 | Fujii | |
| 4,785,199 A * | 11/1988 | Kolodny et al. | 365/185.1 |
| 4,881,114 A | 11/1989 | Mohsen | |
| 5,241,496 A | 8/1993 | Lowrey | |
| 5,330,930 A | 7/1994 | Chi | |
| 5,378,647 A | 1/1995 | Hong | |
| 5,379,253 A | 1/1995 | Bergemont | |
| 5,397,725 A | 3/1995 | Wolstenholme | |
| 5,461,249 A * | 10/1995 | Ozawa | 365/185.01 |
| 5,463,579 A * | 10/1995 | Shimoji | 365/185.16 |
| 5,467,305 A | 11/1995 | Bertin | |
| 5,576,236 A | 11/1996 | Chang | |
| 5,620,913 A * | 4/1997 | Lee | 438/264 |

(Continued)

FOREIGN PATENT DOCUMENTS

EP     84303740.9     1/1985

(Continued)

OTHER PUBLICATIONS

B. Eitan et al., "Characterization of Channel Hot Electron Injection by the Subthreshold Slope of NROM™ Device," IEEE Electron Device Lett., vol. 22, No. 11, (Nov. 2001) pp. 556-558, Copyright 2001 IEEE.

(Continued)

*Primary Examiner*—Jerome Jackson
*Assistant Examiner*—Jesse A. Fenty
(74) *Attorney, Agent, or Firm*—Leffert Jay & Polglaze, P.A.

(57) ABSTRACT

The present invention includes floating gate transistor structures used in non-volatile memory devices such as flash memory devices. In one embodiment, a system includes a CPU and a memory device including an array having memory cells having columnar structures and a floating gate structure interposed between the structures that is positioned closer to one of the structures. In another embodiment, a memory device includes an array having memory cells having adjacent FETs having source/drain regions and a common floating gate structure that is spaced apart from the source/drain region of one FET by a first distance, and spaced apart from the source/drain region of the opposing FET by a second distance. In still another embodiment, a memory device is formed by positioning columnar structures on a substrate, and interposing a floating gate between the structures that is closer to one of the structures.

32 Claims, 11 Drawing Sheets

U.S. PATENT DOCUMENTS

| | | | |
|---|---|---|---|
| 5,768,192 A | 6/1998 | Eitan | |
| 5,792,697 A | 8/1998 | Wen | |
| 5,858,841 A | 1/1999 | Hsu | |
| 5,888,868 A | 3/1999 | Yamazaki | |
| 5,909,618 A | 6/1999 | Forbes | |
| 5,911,106 A | 6/1999 | Tasaka | |
| 5,936,274 A | 8/1999 | Forbes | |
| 5,946,558 A | 8/1999 | Hsu | |
| 5,966,603 A | 10/1999 | Eitan | |
| 5,973,352 A | 10/1999 | Noble | |
| 5,973,356 A | 10/1999 | Noble | |
| 5,991,225 A | 11/1999 | Forbes | |
| 5,994,745 A | 11/1999 | Hong | |
| 6,011,725 A | 1/2000 | Eitan | |
| 6,028,342 A | 2/2000 | Chang | |
| 6,030,871 A | 2/2000 | Eitan | |
| 6,044,022 A | 3/2000 | Nachumovsky | |
| 6,072,209 A | 6/2000 | Noble | |
| 6,081,456 A | 6/2000 | Dadashev | |
| 6,091,102 A | 7/2000 | Sekariapuram | |
| 6,104,061 A | 8/2000 | Forbes | |
| 6,108,240 A | 8/2000 | Lavi | |
| 6,133,102 A | 10/2000 | Wu | |
| 6,134,156 A | 10/2000 | Eitan | |
| 6,134,175 A | 10/2000 | Forbes | |
| 6,143,636 A | 11/2000 | Forbes | |
| 6,147,904 A | 11/2000 | Liron | |
| 6,150,687 A | 11/2000 | Noble | |
| 6,153,468 A | 11/2000 | Forbes | |
| 6,157,570 A | 12/2000 | Nachumovsky | |
| 6,172,396 B1 | 1/2001 | Chang | |
| 6,174,758 B1 | 1/2001 | Nachumovsky | |
| 6,175,523 B1 | 1/2001 | Yang | |
| 6,181,597 B1 | 1/2001 | Nachumovsky | |
| 6,184,089 B1 | 2/2001 | Chang | |
| 6,191,470 B1 | 2/2001 | Forbes | |
| 6,201,282 B1 | 3/2001 | Eitan | |
| 6,201,737 B1 | 3/2001 | Hollmer | |
| 6,204,529 B1 | 3/2001 | Lung | |
| 6,207,504 B1 | 3/2001 | Hsieh | |
| 6,208,164 B1 | 3/2001 | Noble | |
| 6,208,557 B1 | 3/2001 | Bergemont | |
| 6,215,702 B1 | 4/2001 | Derhacobian | |
| 6,218,695 B1 | 4/2001 | Nachumovsky | |
| 6,219,299 B1 | 4/2001 | Forbes | |
| 6,222,768 B1 | 4/2001 | Hollmer | |
| 6,222,769 B1 | 4/2001 | Maruyama | |
| 6,238,976 B1 | 5/2001 | Noble | |
| 6,240,020 B1 | 5/2001 | Yang | |
| 6,243,300 B1 | 6/2001 | Sunkavalli | |
| 6,249,460 B1 | 6/2001 | Forbes | |
| 6,251,731 B1 | 6/2001 | Wu | |
| 6,255,166 B1 | 7/2001 | Ogura | |
| 6,256,231 B1 | 7/2001 | Lavi | |
| 6,266,281 B1 | 7/2001 | Derhacobian | |
| 6,269,023 B1 | 7/2001 | Derhacobian | |
| 6,272,043 B1 | 8/2001 | Hollmer | |
| 6,275,414 B1 | 8/2001 | Randolph | |
| 6,282,118 B1 | 8/2001 | Lung | |
| 6,291,854 B1 | 9/2001 | Peng | |
| 6,297,096 B1 | 10/2001 | Boaz | |
| 6,303,436 B1 | 10/2001 | Sung | |
| 6,327,174 B1 | 12/2001 | Jung | |
| 6,337,808 B1 | 1/2002 | Forbes | |
| 6,348,711 B1 | 2/2002 | Eitan | |
| 6,377,070 B1 | 4/2002 | Forbes | |
| 6,380,585 B1* | 4/2002 | Odanaka et al. | 257/316 |
| 6,383,871 B1 | 5/2002 | Noble | |
| 6,384,448 B1 | 5/2002 | Forbes | |
| 6,392,930 B1 | 5/2002 | Jung | |
| 6,417,049 B1 | 7/2002 | Sung | |
| 6,417,053 B1 | 7/2002 | Kuo | |
| 6,421,275 B1 | 7/2002 | Chen | |
| 6,424,001 B1 | 7/2002 | Forbes | |
| 6,429,063 B1 | 8/2002 | Eitan | |
| 6,432,778 B1 | 8/2002 | Lai | |
| 6,436,764 B1 | 8/2002 | Hsieh | |
| 6,448,601 B1 | 9/2002 | Forbes | |
| 6,448,607 B1 | 9/2002 | Hsu | |
| 6,461,949 B1 | 10/2002 | Chang | |
| 6,468,864 B1 | 10/2002 | Sung | |
| 6,469,342 B1 | 10/2002 | Kuo | |
| 6,476,434 B1 | 11/2002 | Noble | |
| 6,477,084 B1 | 11/2002 | Eitan | |
| 6,486,028 B1 | 11/2002 | Chang | |
| 6,487,050 B1 | 11/2002 | Liu | |
| 6,496,034 B1 | 12/2002 | Forbes | |
| 6,498,377 B1 | 12/2002 | Lin | |
| 6,514,831 B1 | 2/2003 | Liu | |
| 6,531,887 B1 | 3/2003 | Sun | |
| 6,545,309 B1 | 4/2003 | Kuo | |
| 6,552,287 B1 | 4/2003 | Eitan | |
| 6,552,387 B1 | 4/2003 | Eitan | |
| 6,559,013 B1 | 5/2003 | Pan | |
| 6,566,682 B1 | 5/2003 | Forbes | |
| 6,576,511 B1 | 6/2003 | Pan | |
| 6,577,533 B1 | 6/2003 | Sakui | |
| 6,580,135 B1 | 6/2003 | Chen | |
| 6,580,630 B1 | 6/2003 | Liu | |
| 6,597,037 B1 | 7/2003 | Forbes | |
| 6,602,805 B1 | 8/2003 | Chang | |
| 6,607,957 B1 | 8/2003 | Fan | |
| 6,610,586 B1 | 8/2003 | Liu | |
| 6,613,632 B1 | 9/2003 | Liu | |
| 6,617,204 B1 | 9/2003 | Sung | |
| 6,639,268 B1 | 10/2003 | Forbes | |
| 6,642,572 B1* | 11/2003 | Kusumi et al. | 257/315 |
| 6,657,250 B1 | 12/2003 | Rudeck | |
| 6,680,508 B1 | 1/2004 | Rudeck | |
| 6,720,216 B1 | 4/2004 | Forbes | |
| 6,744,094 B1 | 6/2004 | Forbes | |
| 6,762,955 B1 | 7/2004 | Sakui | |
| 6,768,162 B1 | 7/2004 | Chang | |
| 2001/0001075 A1 | 5/2001 | Ngo | |
| 2001/0004332 A1 | 6/2001 | Eitan | |
| 2001/0011755 A1 | 8/2001 | Tasaka | |
| 2001/0022375 A1 | 9/2001 | Hsieh | |
| 2002/0130356 A1 | 9/2002 | Sung | |
| 2002/0142569 A1 | 10/2002 | Chang | |
| 2002/0146885 A1 | 10/2002 | Chen | |
| 2002/0149081 A1 | 10/2002 | Goda | |
| 2002/0151138 A1 | 10/2002 | Liu | |
| 2002/0177275 A1 | 11/2002 | Liu | |
| 2002/0182829 A1 | 12/2002 | Chen | |
| 2003/0042512 A1 | 3/2003 | Gonzalez | |
| 2003/0043637 A1 | 3/2003 | Forbes | |
| 2003/0057997 A1 | 3/2003 | Sun | |
| 2003/0067807 A1 | 4/2003 | Lin | |
| 2003/0113969 A1 | 6/2003 | Cho | |
| 2003/0117861 A1 | 6/2003 | Maayan | |
| 2003/0134478 A1 | 7/2003 | Lai | |
| 2003/0235075 A1 | 12/2003 | Forbes | |
| 2003/0235076 A1 | 12/2003 | Forbes | |
| 2003/0235079 A1 | 12/2003 | Forbes | |
| 2004/0016953 A1 | 1/2004 | Lindsay | |
| 2004/0041203 A1* | 3/2004 | Kim | 257/316 |
| 2004/0063283 A1* | 4/2004 | Guterman et al. | 438/257 |
| 2005/0032308 A1 | 2/2005 | Hsiao | |
| 2005/0133860 A1 | 6/2005 | Forbes | |

FOREIGN PATENT DOCUMENTS

| | | |
|---|---|---|
| EP | 90115805.5 | 2/1991 |
| EP | 0 485 018 A2 | 5/1992 |

| | | |
|---|---|---|
| EP | 0 562 257 A1 | 9/1993 |
| EP | 01113179.4 | 12/2002 |
| EP | 1 271 652 A | 1/2003 |
| JP | 01053577 | 1/1989 |
| JP | 05251711 | 9/1993 |

OTHER PUBLICATIONS

B. Eitan et al., "Spatial Characterization of Hot Carriers Injected into the Gate Dielectric Stack of a MOFSET Based on Non-Volatile Memory Device," date unknown, pp. 58-60.

B. Eitan et al., "NROM: A Novel Localized Trapping, 2-Bit Nonvolatile Memory Cell," IEEE Electron Device Lett, vol. 21, No. 11, (Nov. 2000), pp. 543-545, Copyright 2000 IEEE.

E. Maayan et al., "A 512Mb NROM Flash Data Storage Memory with 8MB/s Data Range," Dig. IEEE Int. Solin-State Circuits Conf., San Francisco, (Feb. 2002), pp. 1-8, Copyright Saifun Semiconductors Ltd. 2002.

E. Maayan et al., "A 512Mb NROM Flash Data Storage Memory with 8MB/s Data Range," ISSCC 2002 Visuals Supplement, Session 6, SRAM and Non-Volatile Memories, 6.1 and 6.2, pp. 76-77, 407-408. Copyright 1990 IEEE.

M. Janai, "Data Retention, Endurance and Acceleration Factors of NROM Devices," IEEE 41st Annual International Reliability Physics Symposium, Dallas, TX (2003), pp. 502-505, Copyright 1989 IEEE.

S. Minami and Y. Kamigaki, "A Novel MONOS Nonvolatile Memory Device Ensuring 10-Year Data Retention after $10^7$ Erase/Write Cycles," IEEE Transactions on Electron Devices, vol. 40, No. 11 (Nov. 1993) pp. 2011-2017, Copyright 1998 IEEE.

C. Pan, K. Wu, P. Freiberger, A. Chatterjee, G. Sery, "A Scaling Methodology for Oxide-Nitride-Oxide Interpoly Dielectric for EPROM Applications," IEEE Transactions on Electron Devices, vol. 37, No. 6, (Jun. 1990), pp. 1439-1443, Copyright 1990 IEEE.

P. Manos and C. Hart, "A Self-Aligned EPROM Structure with Superior Data Retention," IEEE Electron Device Letters, vol. 11, No. 7, (Jul. 1990) pp. 309-311, Copyright 1990 IEEE.

W. Owen and W. Tchon, "$E^2$PROM Product Issues and Technology Trends," IEEE 1989, pp. 17-19, Copryright 1989 IEEE.

T. Huang, F. Jong, T. Chao, H. Lin, L. Leu, K. Young, C. Lin, K. Chiu, "Improving Radiation Hardness of EEPROM/Flash Cell by $N_2O$ Annealing," IEEE Electron Device Letters, vol. 19, No. 7 (Jul. 1998), pp. 256-258, Copyright 1998 IEEE.

B. Eitan et al., "Electrons Retention Model for Localized Charge in Oxide-Nitride-Oxide (ONO) Dielectric," IEEE Device Lett., vol. 23, No. 9, (Sep. 2002), pp. 556-558. Copyright 2002 IEEE.

T. Nozaki, T. Tanaka, Y. Kijiya, E. Kinoshita, T. Tsuchiya, Y. Hayashi, "A 1-Mb EEPROM with MONOS Memory Cell for Semiconductor Disk Application," IEEE Journal of Solid-State Circuits, vol. 26, No. 4 (Apr. 1991), pp. 497-501, Copyright 1991 IEEE.

F. Vollebregt, R. Cuppens, F. Druyts, G. Lemmen, F. Verberne, J. Solo, "A New E(E)PROM Technology With A $TiSi_2$ Control Gate," IEEE 1989, pp. 25.8.1-25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.

B. Eitan et al., "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.

B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.

S. Ogura, et al. "Twin MONOS Cell with Dual Control Gates," Halo LSI and New Halo, pp. 187-187.3, Date Unknown.

T. Sugizaki, et al. "New 2-bit/Tr MONOS Type Flash Memory using $Al_2O_3$ as Charge Trapping Layer," Fujitsu Laboratories Ltd, Date Unknown.

T. Saito, et al. "Hot Hole Erase Characteristics and Reliability in Twin MONOS Device" Halo LSI, Date Unknown.

Saifun Semiconductors, LTD. PowerPoint Presentation, Date Unknown.

Y. Roizin, et al. "Novel Techniques for data retention and Leff measurements in two bit *Micro*Flash® Memory Cells," Characterization and Metrology for ULSI Technology: 200 International Conf., pp. 181-185, Copyright 2001 American Institute of Physics, 1-56396-967-X/01.

W. J. Tsai, et al. "Cause of Data Retention Loss in a Nitride-Based Localized Trapping Storage Flash Memory Cell," IEEE 40th Annual International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-0179-01-722, Copyright 2001 IEEE.

A. Shappir, et al., "Subtreshold slope degradation model for localized-charge-trapping based non-volatile memory devices," Solid-State Electronics 47 (2003), pp. 937-941. Copyright 2003 Elsevier Science Ltd.

R. Neale, "AMD's MirrorBit—a big step in Flash progress," Electronic Engineering Design, V. 74, No. 906, pp. 47-50.

I. Bloom, et al., "NROM™—a new technology for non-volatile memory products" Solid-State Electronics 46 (2002), pp. 1757-1763. Copyright 2002 Elsevier Science Ltd.

J. Bu and M. White, "Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. Minami, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide (ONO) Gates for NROM™ Non-Volatile Semiconductor Memory Devices," Extended Abstracts of the 2001 International Conference on Solid State Devices and Materials, Tokyo, 2001 pp. 534-535.

A. Nughin, "n-Channel 256kb and 1Mb EEPROMs," ISSCC91, Session 134, Special Session on Technology in the USSR, Paper 13.4, 1991 IEEE InternationalSolid State Circuits Conference, Digest of Technical Papers, pp. 228-229, 319.

G. Xue, et al., "Low Voltage Low Cost Nitride Embedded Flash Memory Cell" IMEC., Date Unknown.

L. Breuil, et al., "A new 2 isolated-bits/cell flash memory device with self aligned split gate structure using ONO stacks for charge storage," IMEC, Date Unknown.

J. Willer, et al., "UMEM: A U-shape Non-Volatile-Memory Cell," Ingentix GmbH &Co. KG., Infineon Technologies and Saifun Semiconductors, Date Unknown.

S. Kang, et al., "A Study of SONOS Nonvolatile Memory Cell Controlled Structurally by Localizing Charge-Trapping Layer," Samsung Electrons Co., Ltd., Date Unknown.

Y. Roizin, et al., "In-Process Charging in *micro*FLASH® Memory Cells," Tower Semiconductor, Ltd., Date Unknown.

A. Shappir, et al., "Subthreshold slope degradation model for localized-charge-trapping based non-volatile memory devices," Solid State Electronics, 47 (2003) pp. 937-941, Copyright 2003 Elsevier Science Ltd.

I. Fujiwara, et al., "High speed program/erase sub 100 nm MONOS memory cell," Sony Corporation, Date Unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1-2., Date Unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao-Tung University, Date Unknown.

Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., Date Unknown.

J. H. Kim, et al., "Highly Manufacturable SONOS Non-Volatile Memory for the Embedded SoC Solution," 2003 Symposium on VLSI Technology Digest of Technical Papers, pp. 31-32.

Y. Hayashi, et al., "Twin MONOS Cell with Dual Control Gates," 2000 Symposium on VLSI Technology Digest of Technical Papers, 2000 IEEE, pp. 122-123.

M. K. Cho and D. M. Kim, "High Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.

T. Y. Chan, K.K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.

I. Bloom, et al., "NROM™ NVM technology for Multi-Media Applications," Saifun Semiconductors, Ltd. Ingentix, Ltd. and Infineon Technologies, Date Unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, Date Unknown.

Y. Roizin, et al., "Retention Characteristics of *micro*FLASH® Memory (Activation Energy of Traps in the ONO Stack)," Tower Semiconductor, Ltd., Date Uknown.

Y. Roizin, et al., "Activation Energy of Traps in the ONO Stack of *micro*FLASH® Memory Cells," Tower Semiconductor, Ltd., Date Unknown.

Y. Roizin, et al., "'Dummy' Gox for Optimization of *micro*FLASH® Technology," Tower Semiconductor, Ltd., Date Unknown.

Y. K. Lee, et al., "Multi-Level Vertical Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI., Date Unknown.

J. Bu, et al., "Retention Reliability Enhanced SONOS NVSM with Scaled Programming Voltage," Microelectronics Lab., Date Unknown.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147-148.

U.S. Appl. No. 10/769,116, filed Dec. 17, 2003, Forbes.

U.S. Appl. No. 10/785,310, filed Feb. 24, 2004, Forbes.

Cappelletti, P. et al., "Failure Mechanisms of Flash Cell in Program/Erase Cycling", IEEE, 1994, IEDM-94, pp. 291-294.

Guan, Huinan et al., "On Scaling of SST Split-Gate Flash Memory Technologies", Department of Electrical and Computer Engineering, University of California, Irvine, Final Report 1998-1999 for MICRO Project 98-080.

Pavan, Paolo et al., "Flash Memory Cells —An Overview", *Proceedings of the IEEE*, vol. 85, No. 8, Aug. 1997, pp. 1248-1271.

Seo, Jin-ho et al., "Charge-to-Breakdown Characteristics of Thin Gate Oxide and Buried Oxide on SIMOX SOI Wafers", *Journal of the Electrochemical Society*, vol. 144, No. 1, Jan. 1997, pp. 375-378.

* cited by examiner

APPARATUS AND METHOD FOR SPLIT TRANSISTOR MEMORY HAVING IMPROVED ENDURANCE

TECHNICAL FIELD

The present invention relates generally to semiconductor memory devices, and in particular to floating gate transistor structures used in non-volatile semiconductor memory devices such as flash memory devices.

BACKGROUND OF THE INVENTION

Flash memory devices are high density, non-volatile memory devices having low power consumption, fast access times and low cost. Flash memory devices are thus well suited for use in a variety of portable electronic devices that require high density storage but cannot support a disk drive, or other mass storage devices due to high power consumption or the additional weight of such devices. An additional advantage of flash memory is that it offers in-circuit programmability. A flash memory device may thus be reprogrammed under software control while the device resides on a circuit board within an electronic device.

FIG. 1 is a flash memory cell 10 according to the prior art. The flash memory cell 10 has a metal oxide semiconductor (MOS) structure that includes a substrate 12, a pair of source/drain regions 14, a floating gate 18 overlying a MOS channel region 16, and a control gate 20 overlying the floating gate 18. An oxide structure 22 separates the floating gate 18 from the channel region 16, and also separates the floating gate 18 from the control gate 20. For the device shown, the substrate 12 is doped with P-type impurities, and the source/drain regions 14 are doped with N-type impurities.

The memory cell 10 may be programmed by applying a sufficiently positive gate voltage $V_{CG}$ and a positive drain voltage $V_D$ to the device 10, while maintaining the source voltage $V_S$ at a zero, or ground potential. As charge is moved to the floating gate 18 from the source/drain region 14, the device 10 attains a logic state "0". Alternately, if little or no charge is present at the floating gate 18, a logic state corresponding to "1" is stored on the device 10.

To read the state of the device 10, a positive voltage $V_{CG}$ of predetermined magnitude is applied to the control gate 18, while $V_D$ is maintained positive. If the voltage applied to the control gate 18 is sufficient to turn the device 10 on, a current flows from one source/drain region 14 to the other source/drain region 14 that may be detected by other external circuits, thus indicating the logic state "1". Correspondingly, if sufficient charge exists at the floating gate 18 to prevent the device 10 from turning on, a logic state of "0" is read. A logic state may be erased from the device 10 by applying a positive source voltage $V_S$ to the source/drain region 14 while $V_{CG}$ is maintained at a negative potential. The device 10 attains a logic state "1" following an erase cycle.

Although the foregoing flash memory cell 10 is highly effective to store a logic state in a memory device, it has been observed that the programming efficiency of the memory cell 10 is degraded as the number of accumulated program/erase cycles increases. As a result, the cell 10 may fail after the number of program/erase cycles exceeds a limiting value, which is termed the endurance limit for the cell 10. Although the endurance limit is relatively unimportant in cases where the cell 10 is programmed only once, it may be a critical concern where the device 10 is erased and reprogrammed numerous times. The degradation of the programming efficiency is believed to result from hot electrons that become trapped in the relatively thin oxide layer separating the floating gate 18 from the substrate 12 during a programming cycle, which permanently damages the oxide layer. In addition, extremely high electric field strengths are generated during erase cycles that cause holes having relatively low momentum to become trapped in the oxide layer separating the floating gate 18 and the substrate 12. As the cell 10 is subjected to repeated program/erase cycles, the trapped holes accumulate in the oxide layer and thus cause the electric fields applied during a read cycle to be degraded.

The qualitative effects of degradation of the flash memory cell 10 are shown in FIGS. 2–4. FIG. 2 compares the performance of a non-cycled flash memory cell 10 with the performance of the cell 10 after it has been subjected to a substantial number of erase and programming cycles. As shown in FIG. 2, the source/drain current $I_{DS}$ for the cycled cell 10 is significantly lower that obtained from a non-cycled cell 10 for a comparable fixed control gate voltage $V_{CG}$. As a consequence, the determination of a logic state during a read cycle is adversely affected due to the lowered source/drain current in the cycled cell 10. This effect is further shown to FIG. 3, where the source/drain current $I_{DS}$ of the cell 10 is observed to steadily decrease as the number of cycles accumulates on the cell 10. FIG. 3 also shows that the endurance limit for the cell 10 may occur between approximately $10^5$ and $10^6$ cycles.

FIG. 4 shows the variation of a threshold voltage $V_T$ for the cell 10 as the number of program/erase cycles is increased. The threshold voltage $V_T$ is defined as the minimum required voltage to turn on a cell 10 during a read cycle. In FIG. 4, $V_{T,1}$ corresponds the threshold value required to turn on the cell 10 when the floating gate of the cell 10 is charged (indicating logic state "0"), while $V_{T,2}$ corresponds to the threshold value required to turn on the cell 10 when the floating gate 18 is not charged. The difference between the $V_{T,1}$ and $V_{T,2}$ values thus defines a threshold voltage "window", as shown in FIG. 4. As the cell 10 is subjected to cycling, the "window" becomes progressively smaller, so that it becomes more difficult to distinguish between the two logic states stored in the cell 10.

One prior art solution to the foregoing endurance limit problem is a flash memory cell having a floating gate asymmetrically positioned towards the source, with the control gate overlying the floating gate and also directly overlying the channel region of the cell, as disclosed in detail in an article by P. Pavan, et al., entitled "Flash Memories-An Overview", *IEEE Proceedings*, vol. 85, No. 8, pp. 1248–1271, 1997. Since the programming and erase functions occur in the portion of the channel region adjacent to the source, damage to the gate oxide is limited to only a portion of the channel region. Although the foregoing flash memory cell arrangement achieves some increase in the endurance limit, the damage to the oxide layer underlying the floating gate eventually becomes excessive, so that it is no longer possible to read the logic state stored in the cell.

Another prior art flash memory cell includes a source region that is surrounded by an N– region to further protect the source junction of the cell from the large electric field strengths that arise when the cell is erased. One significant drawback present in this configuration is that the source and drain regions may not be interchanged to extend the endurance of the cell. Further, the asymmetrical arrangement adds to the overall fabrication costs of the flash memory device.

Accordingly, there is a need in the art for a flash memory device having an enhanced endurance limit.

SUMMARY OF THE INVENTION

The present invention is directed towards systems, apparatuses and methods for forming floating gate transistor structures used in non-volatile semiconductor memory devices such as flash memory devices. In one aspect, the system may include a central processing unit (CPU), and a memory device coupled to the processor that includes an array having memory cells, each cell including a first columnar structure and a spaced apart second columnar structure having a floating gate structure interposed between the first columnar structure and the second columnar structure and spaced apart from the first and second structures, the floating gate being positioned closer to a selected one of the first and second structures. In another aspect, a memory device includes an array having memory cells having first and second adjacent field effect transistors (FETs) having respective source/drain regions and a common floating gate structure that is spaced apart from the source/drain regions of the first FET by a first distance, and spaced apart from the source/drain regions of the second FET by a second distance. In still another aspect of the invention, a method of forming a memory device having a plurality of interconnected memory cells includes positioning a first columnar structure on a substrate, positioning a second columnar structure on the substrate that is spaced apart from the first columnar structure, forming a gate structure between the first structure and the second structure; and interposing a floating gate structure between the first structure and the gate structure and between the second structure and the gate structure, the floating gate structure being positioned closer to selected one of the first structure and the second structure.

DETAILED DESCRIPTION OF THE INVENTION

The present invention is generally directed to semiconductor memory devices, and in particular to floating gate transistor structures used in non-volatile semiconductor memory devices such as flash memory devices. Many of the specific details of certain embodiments of the invention are set forth in the following description and in FIGS. 5–17 to provide a thorough understanding of such embodiments. One skilled in the art will understand, however, that the present invention may be practiced without several of the details described in the following description. Moreover, in the description that follows, it is understood that the figures related to the various embodiments are not to be interpreted as conveying any specific or relative physical dimension. Instead, it is understood that specific or relative dimensions related to the embodiments, if stated, are not to be considered limiting unless the claims expressly state otherwise.

Figure 1:
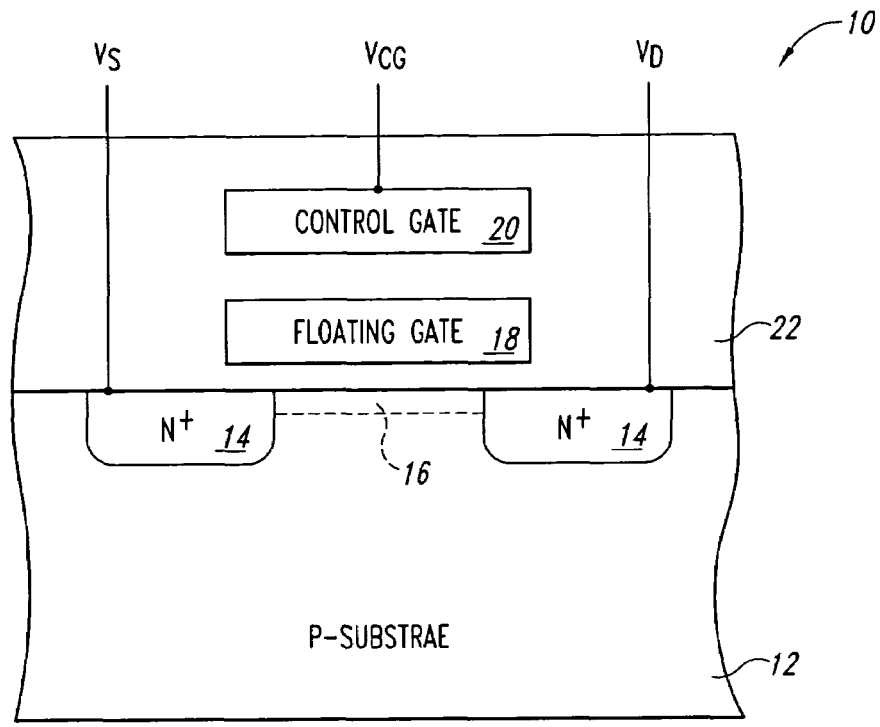
FIG. 1 is a cross sectional view of a flash memory cell according to the prior art.
Figure 2:
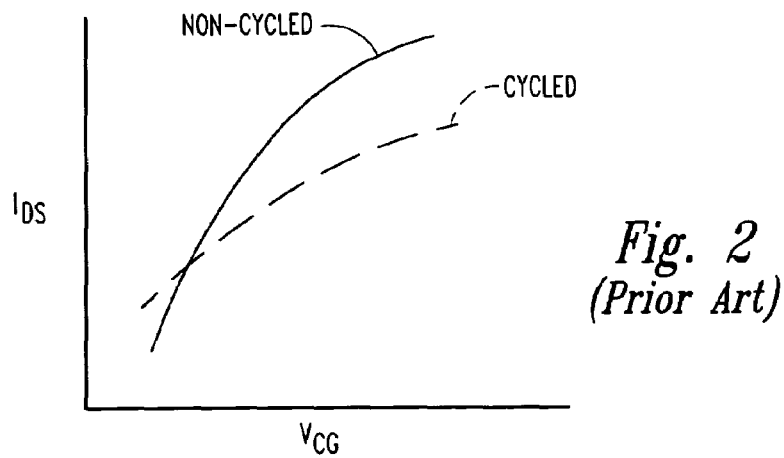
FIG. 2 is a graph that qualitatively compares the drain/source current performance for a cycled and a non-cycled flash memory cell.
Figure 3:
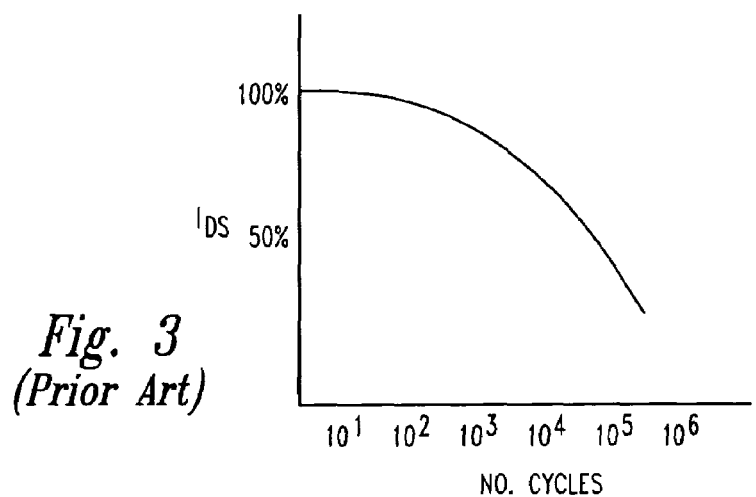
FIG. 3 is graph that qualitatively illustrates the degradation of the drain/source current performance as the number of cycles is increased for a flash memory cell.
Figure 4:
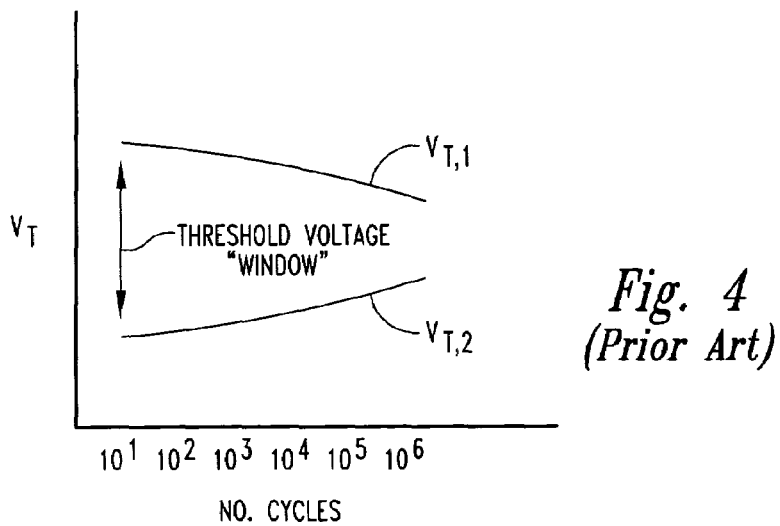
FIG. 4 is graph that qualitatively illustrates the narrowing of the voltage threshold window of a flash memory cell as the number of cycles is increased.
Figure 5:
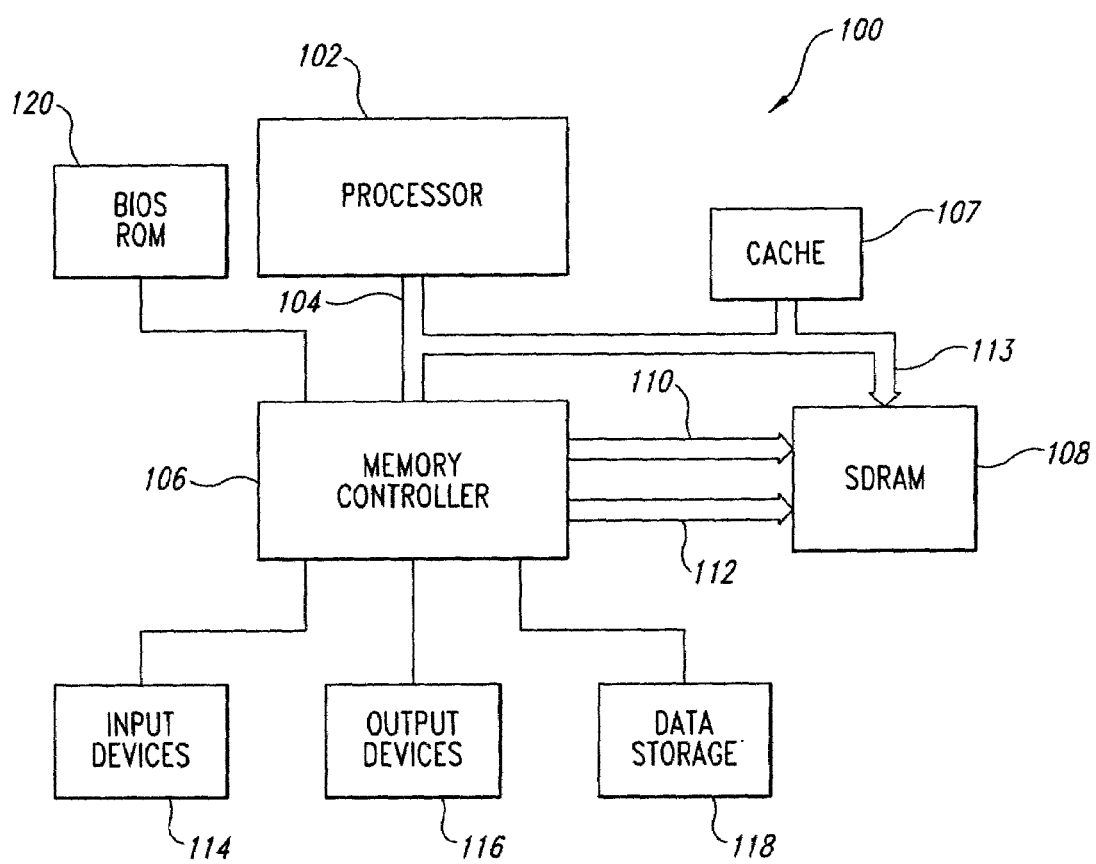
FIG. 5 is a block diagram of a computer system 100 according to an embodiment of the invention.

FIG. 5 shows an embodiment of a computer system 100 that may use the memory device of FIGS. 6–17 or some other embodiment of a memory device according to the present invention. The computer system 100 includes a processor 102 for performing various computing functions, such as executing specific software to perform specific calculations or tasks. The processor 102 includes a processor bus 104 that normally includes an address bus, a control bus, and a data bus. The processor bus 104 is coupled to a memory controller 106, which is, in turn, coupled to a number of other components. The processor 102 is also typically coupled through the processor bus 104 to a cache memory 107, which is usually a static random access memory ("SRAM") device.

The memory controller 106 is coupled to system memory in the form of a synchronous random access memory ("SDRAM") device 108 through an address bus 110 and a control bus 112. An external data bus 113 of the SDRAM device 108 is coupled to the data bus of the processor 102, either directly or through the memory controller 106.

The memory controller 106 is also coupled to one or more input devices 114, such as a keyboard or a mouse, to allow an operator to interface with the computer system 100. Typically, the computer system 100 also includes one or more output devices 116 coupled to the processor 102 through the memory controller 106, such output devices typically being a printer or a video terminal. One or more data storage devices 118 are also typically coupled to the processor 102 through the memory controller 106 to store data or retrieve data from external storage media (not shown). Examples of typical storage devices 118 include hard and floppy disks, tape cassettes, and compact disk read-only memories (CD-ROMs). Finally, the memory controller 106 is coupled to a basic input-output ("BIOS") read only memory ("ROM") device 120 for storing a BIOS program that is executed by the processor 102 at power-up. The processor 102 may execute the processor 102 either directly from the BIOS ROM device 120 or from the SDRAM device 108 after the BIOS program has been shadowed by transferring it from the BIOS ROM device 120 to the SDRAM device 108. The BIOS ROM device 120 is preferably a non-volatile memory device according to the present invention, such as the embodiments of the invention shown in the memory device of FIGS. 6–17. Memory devices according to present embodiments may also be used in the computer system 100 for other functions.

Figure 6:
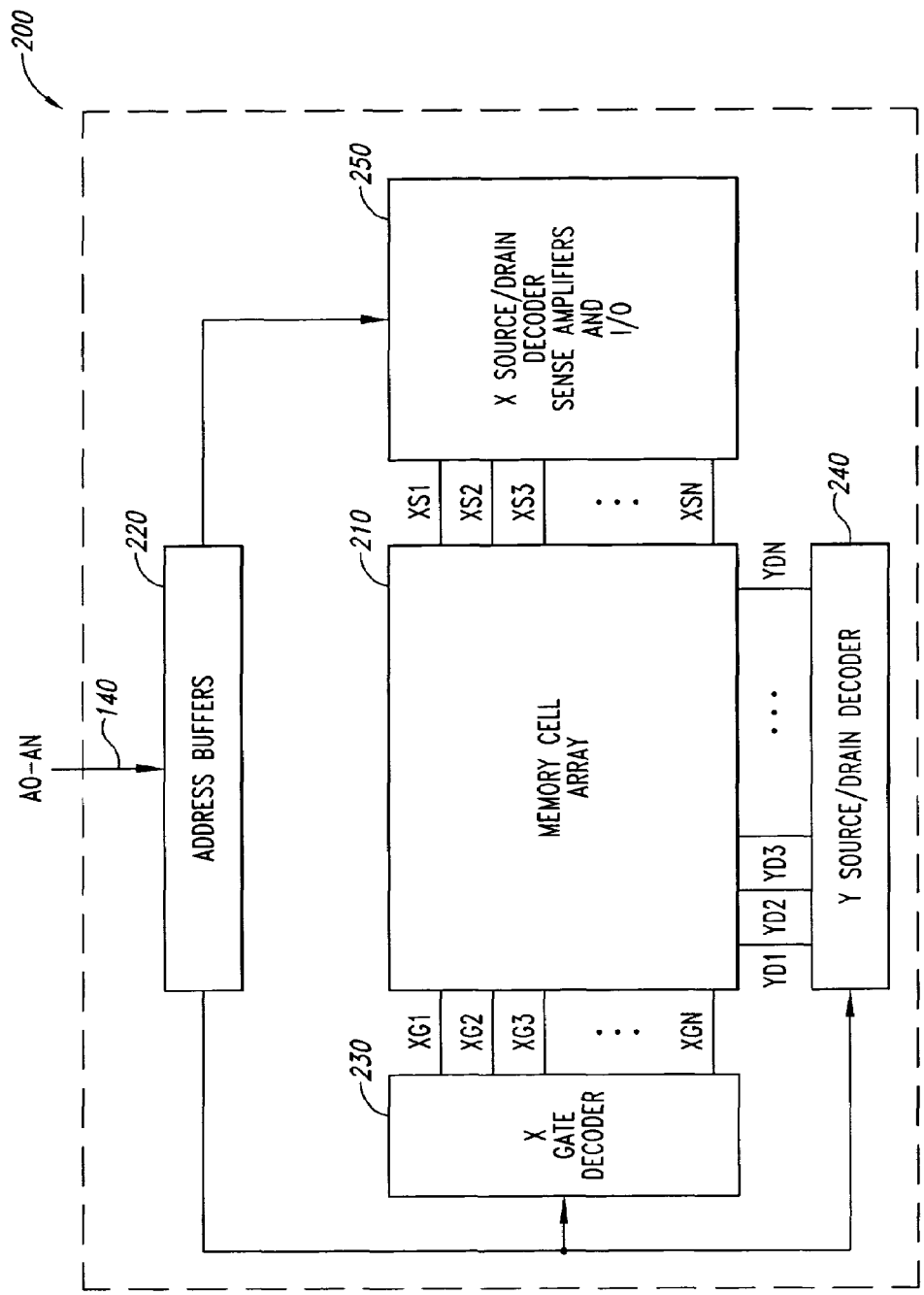
FIG. 6 is a block diagram of a memory device according to another embodiment of the present invention.

FIG. 6 is a block diagram of a memory device 200 according to an embodiment of the present invention, which may comprise at least a portion of the memory 108 shown in FIG. 5. The memory device 200 includes a memory cell array 210 that includes memory cells comprised of floating gate FET transistor devices as will be described in greater detail below. The memory device 200 also includes an x-gate decoder 230 that provides a plurality of gate lines XG1, XG2 . . . XGN for addressing the cells in the memory cell array 210. A y-source/drain decoder 240 provides a plurality of source/drain lines YD1, YD2 . . . YDN for accessing the first source/drain regions of the floating gate FET transistor cells in the array 210. An x-source/drain decoder 250 similarly provides a plurality of data lines XS1, XS2 . . . XSN for accessing second source/drain regions of the cells in the memory array 210. The x-source/drain decoder 250 may also include sense amplifiers and input/output (I/O) devices for reading, writing or erasing data from the memory cell array 210. The memory device 200 further includes address buffers 220 that receive address signals A0 . . . AN from the address bus 140 (as shown in FIG. 5). The address buffers 220 are coupled to the x-gate decoder 230, the y-source/drain decoder 240 and the x-source/drain decoder 250 to control the reading, writing and erasing operations on the memory cells in the memory cell array 210.

Figure 7:
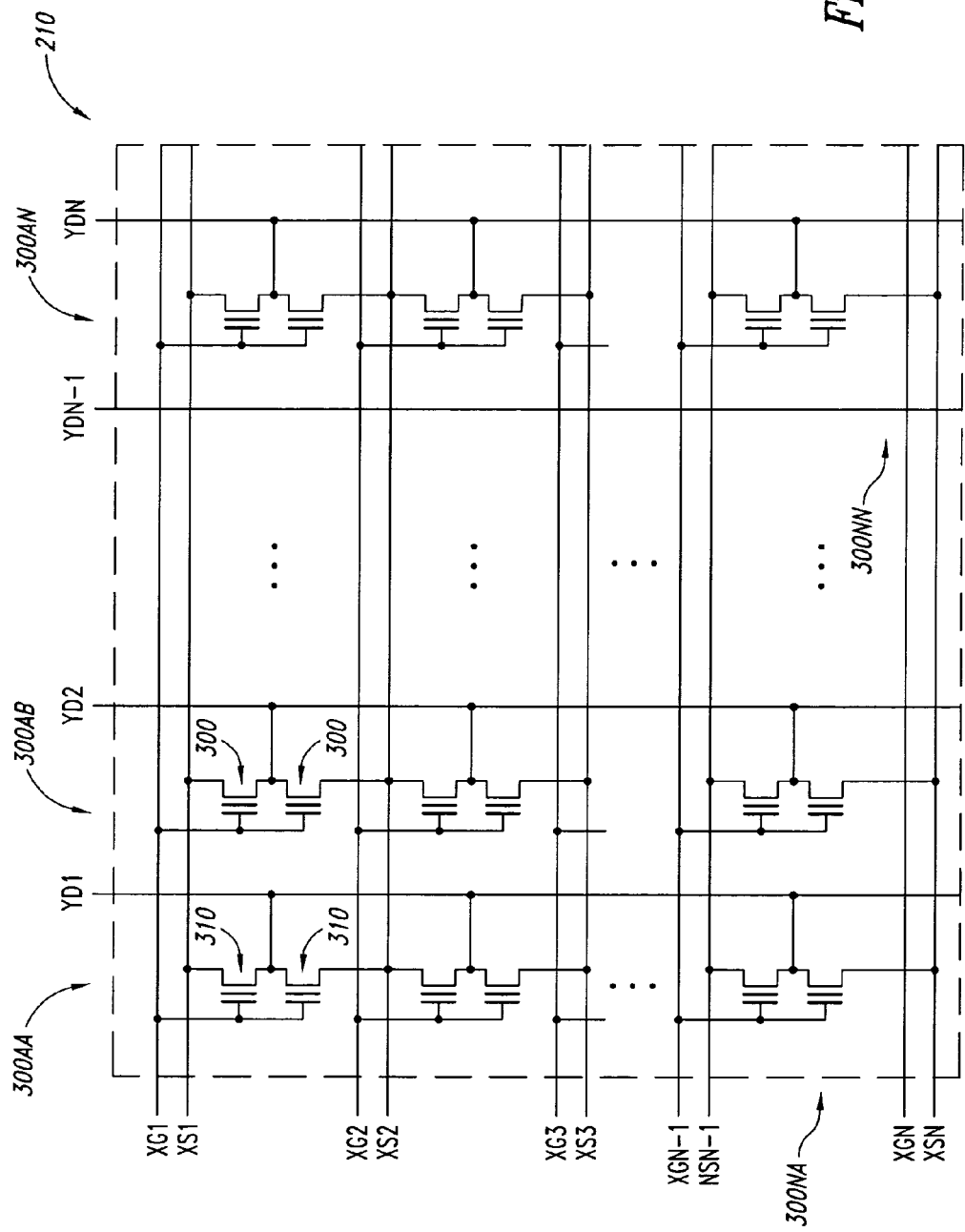
FIG. 7 is a partial schematic diagram of a memory cell array according to an embodiment of the invention.

FIG. 7 is a partial schematic diagram illustrating an embodiment of the memory cell array 210, as shown in FIG. 6. The memory cell array 210 includes a plurality of adjacent and interconnected memory cells 300 of substantially similar configuration that extend in a first direction along a row of the array 210 from a cell 300AA to a cell 300AN. The array further extends in a second direction to a row 300 NA that further extends in the first direction to a cell 300NN. Each of the memory cells 300AA through 300NN includes a pair of field effect transistors (FETs) 310 having an electrically isolated floating gate that controls the conduction between the source and drain regions in the FETs 310. The FETs 310 in each of the cells 300AA to 300NN share a common gate, such as XG1, XG2. . . XGN, and are formed in columnar structures, as described in greater detail below.

Figure 8:
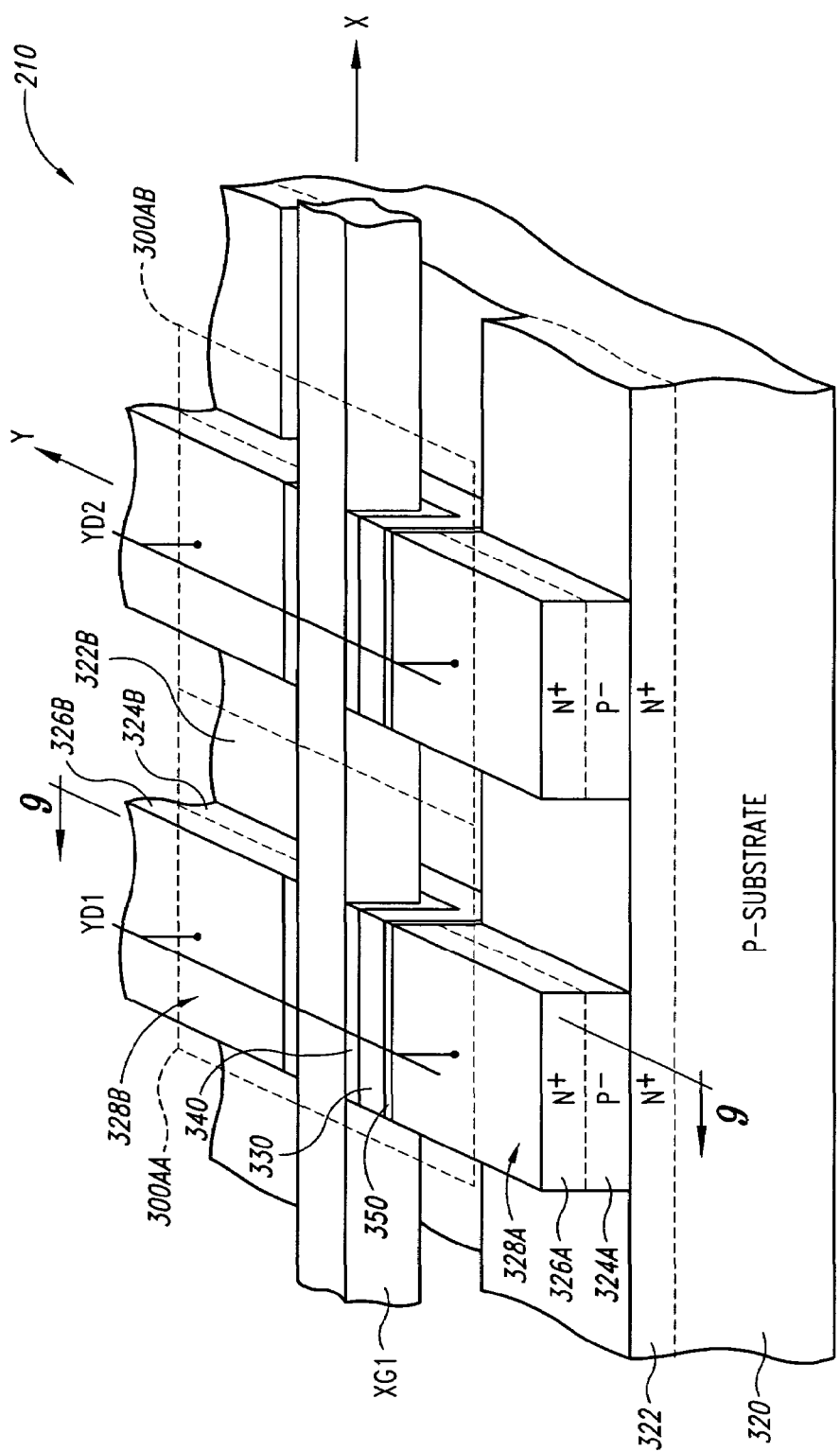
FIG. 8 is a partial isometric view of a portion of a memory cell array according to an embodiment of the invention.

FIG. 8 is a partial isometric view illustrating a portion of the memory cell array 210 of FIG. 7. For clarity of illustration, only memory cells 300AA and 300AB of the array 210 are shown, and in the following description, only memory cell 300AA will be described. It is understood, however, that the array 210 includes a substantial number of cells having a substantially similar structure, so that the array 210 extends in a first direction (the "x" direction, as shown in FIG. 8), and also in a second direction (the "y" direction, also as shown in FIG. 8) that is substantially perpendicular to the first direction. The cell 300AA includes a pair of columnar structures 328A and 328B formed on a p-type substrate 320. Each of the columnar structures 328 includes a first source/drain region 322 comprised of a material having an N+ conductivity that extends along the substrate 320 in the x-direction. The structures 328A and 328B further include a second source/drain region 326 also having an N+ conductivity that is positioned adjacent to the first source/drain region 322. A separation layer 324 of material doped to have a conductivity of P– is interposed between the first source/drain region 322 and the second source/drain region 328.

Still referring to FIG. 8, the columnar structures 328A and 328B are spaced apart to permit the gate line XG1 to be positioned between the structures 328A and 328B. A floating gate 330 is interposed between the structure 328A and the gate line XG1, and between the structure 328B and the gate line XG1. The floating gate 330 further extends below the gate line XG1 so that the floating gate 330 is also interposed between the gate line XG1 and the underlying substrate 320 to form a single control gate 330 between the structures 328A and 328B. The floating gate 330 is electrically isolated from the gate line XG1 by a first dielectric layer 340 that is interposed between the gate line XG1 and the floating gate 330. The floating gate 330 is further electrically isolated from the first structure 328A and the second structure 328B by a second dielectric layer 350 interposed between the floating gate 330 and the structures 328A and 328B. The floating gate 330 is further positioned between the first structure 328A and the second structure 328B so that the floating gate 330 is positioned closer to the first structure 328A than to the second structure 328B, as will be shown in greater detail below. Accordingly, a portion of the second dielectric 350 that is substantially adjacent to the first structure 328A is thinner than a corresponding portion of the second dielectric 350 that is adjacent to the second structure 328B. One skilled in the art will recognize, however, that the thinner portion of the second dielectric 350 may be positioned adjacent to the second structure 328B, while a thicker portion of the second dielectric 350 is positioned adjacent to the first structure 328A. The floating gate 330 may be comprised of a polysilicon material that is deposited on the array 210 during a fabrication process, as will also be described in greater detail below. The first dielectric layer 340 and the second dielectric layer 350 may be comprised of silicon dioxide that is grown or deposited during the fabrication of the array 210, although other similar dielectric materials may also be used.

The second source/drain region 326A of the first structure 328A and the second source/drain region 326B of the second structure 328B are interconnected by a data line YD1 that is comprised of a metallic or other interconnection line that is substantially electrically isolated from the underlying topology of the array 210. Accordingly, it is understood that the array 210 as shown in FIG. 8 may be overlaid by a layer of a dielectric material (not shown) that includes contact penetrations that are etched in the dielectric material in order to permit the data line YD1 to be connected to the first structure 328A and the second structure 328B.

Figure 9:
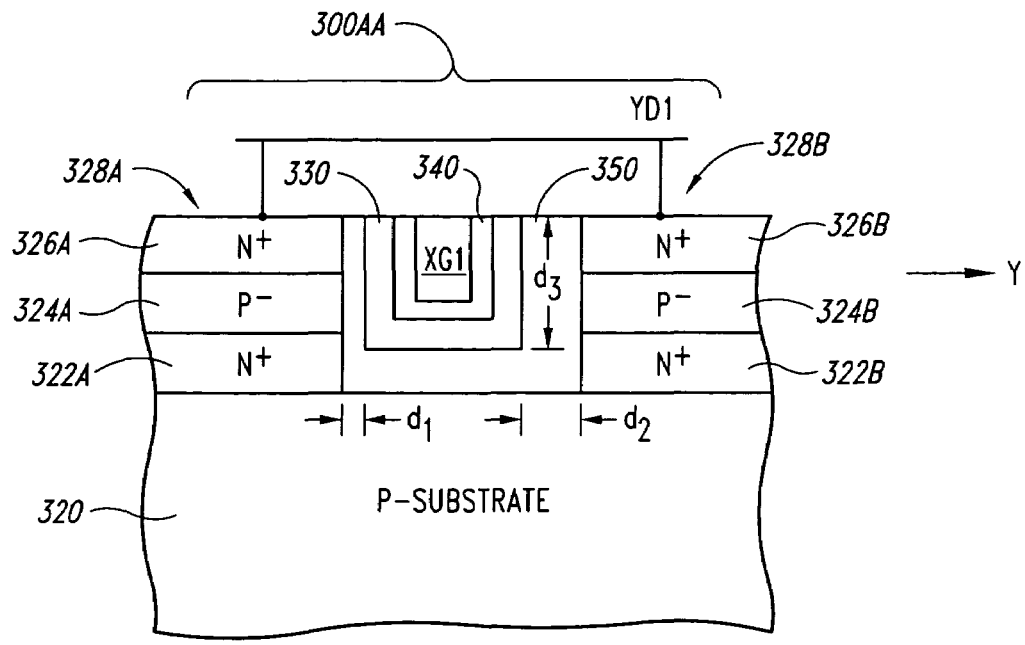
FIG. 9 is a partial cross sectional view of a memory array according to an embodiment of the invention.

FIG. 9 is a partial cross sectional view of the memory array 210 that is viewed from the section line 9—9 of FIG. 8, and thus viewed generally parallel to the x-direction shown in FIG. 8. As noted above, the floating gate 330 is separated from the first structure 328A and the second structure 328B by dissimilar thicknesses of the second dielectric layer 350. Accordingly, the first structure 328A is spaced apart from the floating gate 330 by a first distance $d_1$, and the second structure 328B is spaced apart from the floating gate 330 by a second distance $d_2$, where the first distance $d_1$ is less than the second distance $d_2$. In a particular embodiment, the second distance $d_2$ is approximately about two times the thickness of the first distance $d_1$. In another particular embodiment, the floating gate 330 has a height $d_3$ of approximately about 0.1 μm, and is spaced apart from the first and second structures 328A and 328B by a first distance $d_1$ of approximately about 33 Å and a second distance $d_2$ of approximately about 66 Å.

Figure 10:
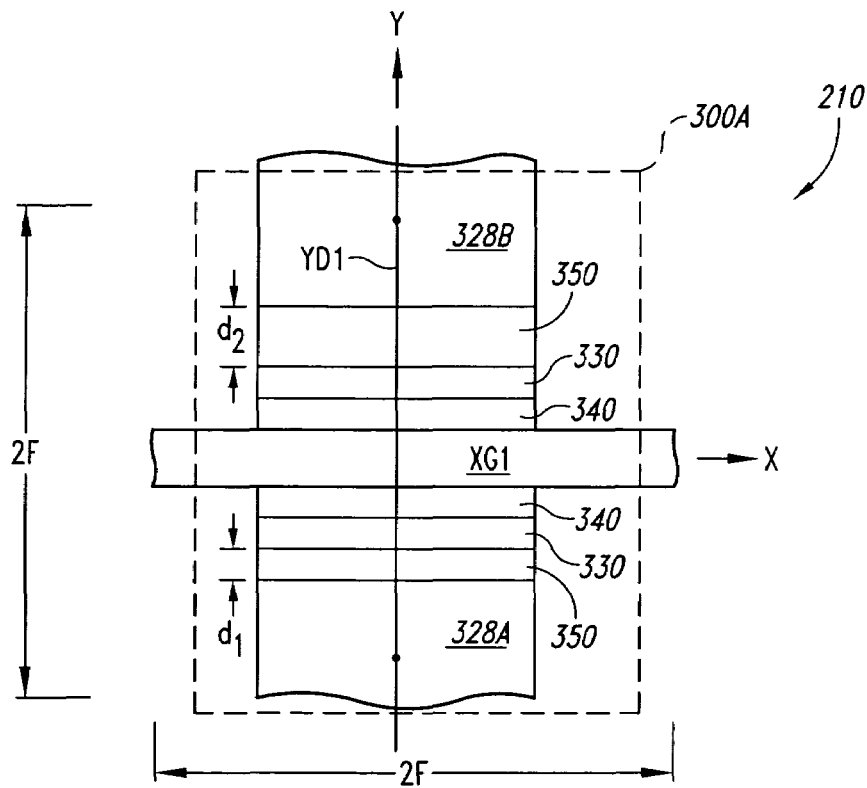
FIG. 10 is a partial plan view of a memory array according to an embodiment of the invention.

FIG. 10 is a partial plan view of the memory array 210 shown in FIG. 9. In particular, the cell 300AA has a pitch that extends in the y-direction of approximately about 2F, and a pitch that extends in the x-direction approximately about 2 F, where F is characteristic dimension associated with a minimum lithographic feature size. Accordingly, a logic state corresponding to a single data bit may be advantageously stored in an area of approximately about $4F^2$. This compares favorably with a feature size of $8F^2$ for the well-known folded array architecture commonly found in DRAM memory arrays.

The foregoing embodiment provides still other advantages over the prior art. For example, and with reference again to FIG. 9, since programming and erase functions are performed on the first structure 328A that is spaced apart from the floating gate 330 by a generally thinner portion of the dielectric layer 350, charge trapping in the thinner oxide layer will have only a minor effect on the opposing second structure 328B that is positioned adjacent to a generally thicker portion of the dielectric layer 350 during read operations.

Figure 11:
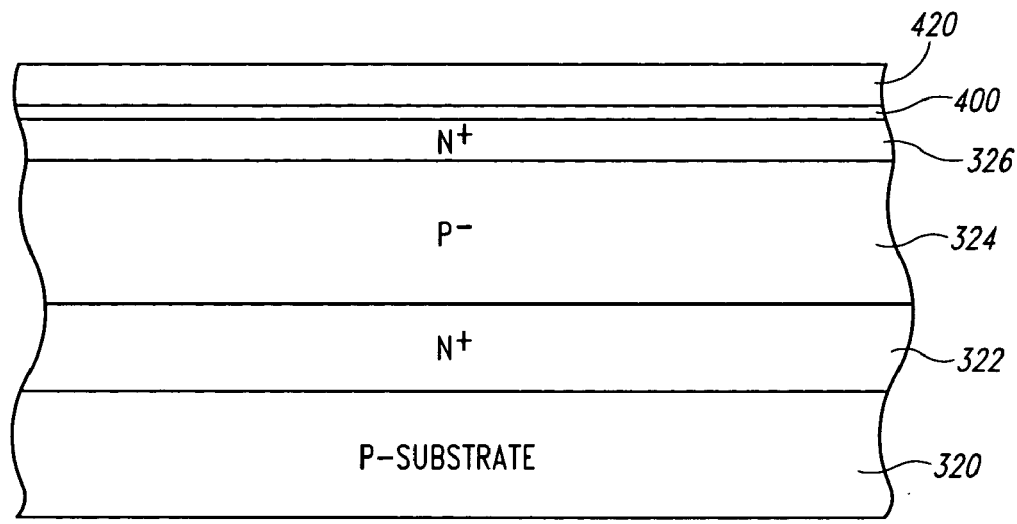
FIG. 11 is a partial cross sectional view that illustrates a step in a method for forming a memory array according to another embodiment of the invention.

FIGS. 11–16 are partial cross sectional views that illustrate steps in a method for forming a memory array according to another embodiment of the invention. Referring first to FIG. 11, a substrate 320 formed from silicon and doped to a P– conductivity is used as a starting material. A first source/drain region 322 is formed on the substrate 320. The region 322 may be formed on the substrate 320 by ion implantation or other similar processes in order to attain the desired N+ conductivity. Alternately, an epitaxial layer of N+ silicon may be grown on a surface of the substrate 320. A separation layer 324 may then be formed on the first source/drain region 322 by an epitaxial growth of P– silicon to a desired thickness. A second source/drain layer 326 may be formed on the separation layer 324 by another epitaxial growth of N+ silicon. A pad layer 400 comprised of silicon oxide may be formed on an exposed surface of the second source/drain layer 326, which may be overlayed by a pad layer 420, comprised of silicon nitride.

Figure 12:
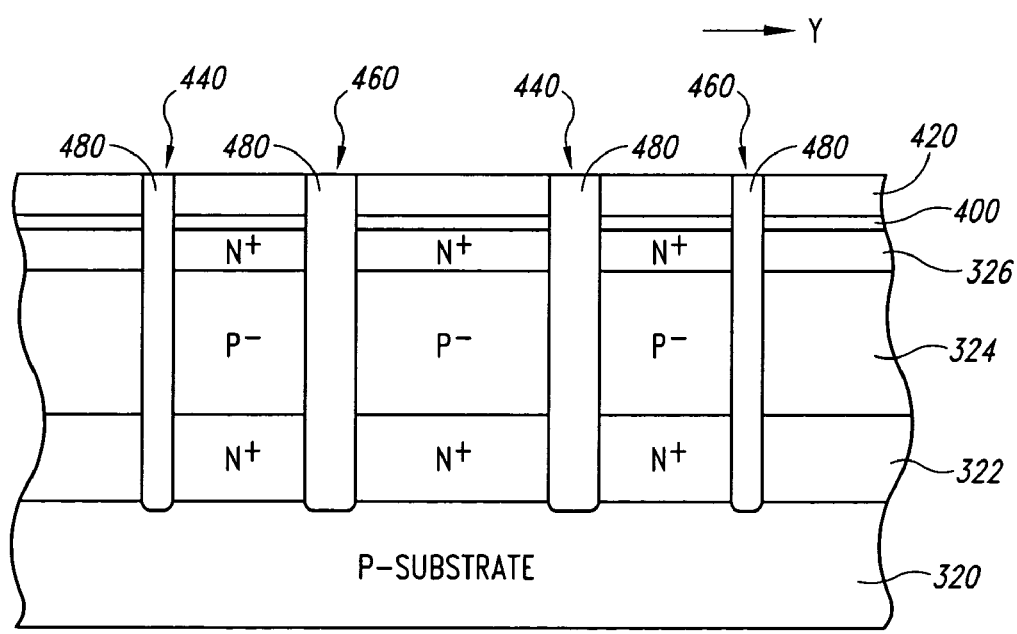
FIG. 12 is a partial cross sectional view that illustrates a step in a method for forming a memory array according to another embodiment of the invention.

Turning now to FIG. 12, a plurality of first trenches 440 and a plurality of second trenches 460 are formed in the structure shown in FIG. 11. The first trenches 440 and the second trenches 460 are formed in the structure of FIG. 11 in a direction that is approximately perpendicular to the y-direction and are further substantially mutually parallel. The first trenches 440 and the second trenches 460 project downwardly into the structure to the p-subtrate layer 320. The first trenches 440 and the second trenches 460 may be formed by patterning an exposed surface of the structure shown in FIG. 11 with a layer of photoresist (not shown in FIG. 12) to form an etch barrier having exposed surface portions that coincide with the intended locations of the first trenches 440 and the second trenches 460. The substrate material underlying the exposed surface portions may be removed by plasma etch methods, or by wet etching method known in the art.

Figure 13:
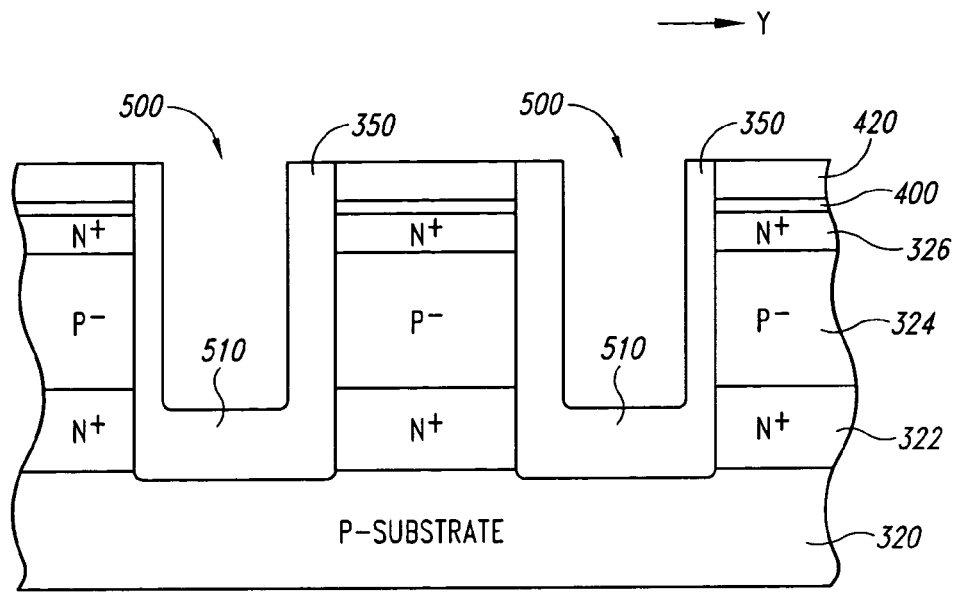
FIG. 13 is a partial cross sectional view that illustrates a step in a method for forming a memory array according to another embodiment of the invention.

Still referring to FIG. 12, the first trenches 440 and the second trenches 460 are substantially filled with silicon dioxide 480 that is grown in the first trenches 440 and second trenches 460 through an oxidation process, or deposited in the first trenches 440 and second trenches 460 by other well-known methods. The material positioned between the first trenches 440 and the second trenches 460 (as shown in FIG. 12) is removed by forming another etch stop layer of photoresist (not shown) and removing the material by wet or plasma etch methods to form voids 500, as shown in FIG. 13. A bottom portion 510 comprising a silicon dioxide material is formed by oxidation, or other well-known deposition processes to form the second dielectric layer 350.

Figure 14:
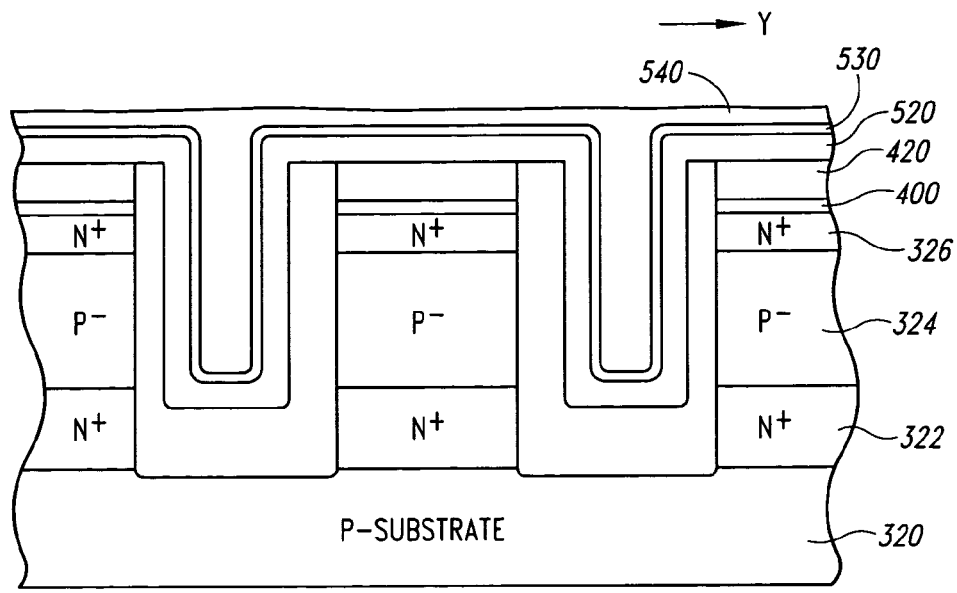
FIG. 14 is a partial cross sectional view that illustrates a step in a method for forming a memory array according to another embodiment of the invention.

Referring now to FIG. 14, a polysilicon layer 520 is formed on the structure of FIG. 13, which extends downwardly into each of the voids 500 of FIG. 13. The polysilicon layer 520 may be deposited on the structure by various well-known methods. An oxide layer 530 is then formed on the polysilicon layer 520 by exposing the polysilicon layer 520 to an oxidation process. A polysilicon or metal layer 540 may then be formed over the oxide layer 530 by various well-known polysilicon or metal deposition methods.

Figure 15:
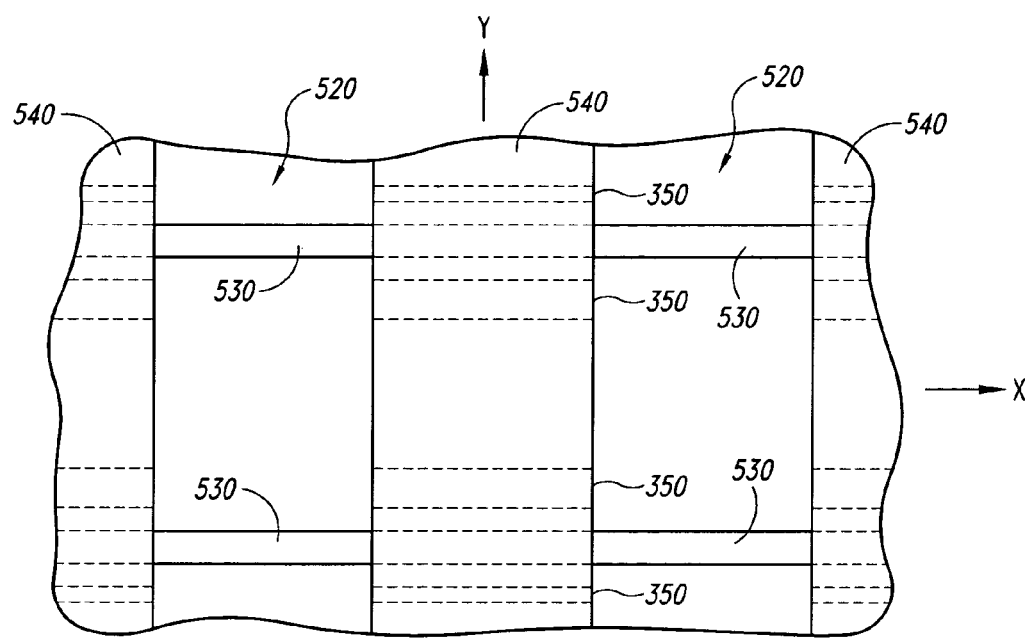
FIG. 15 is a partial plan view that illustrates a step in a method for forming a memory array according to another embodiment of the invention.
Figure 16:
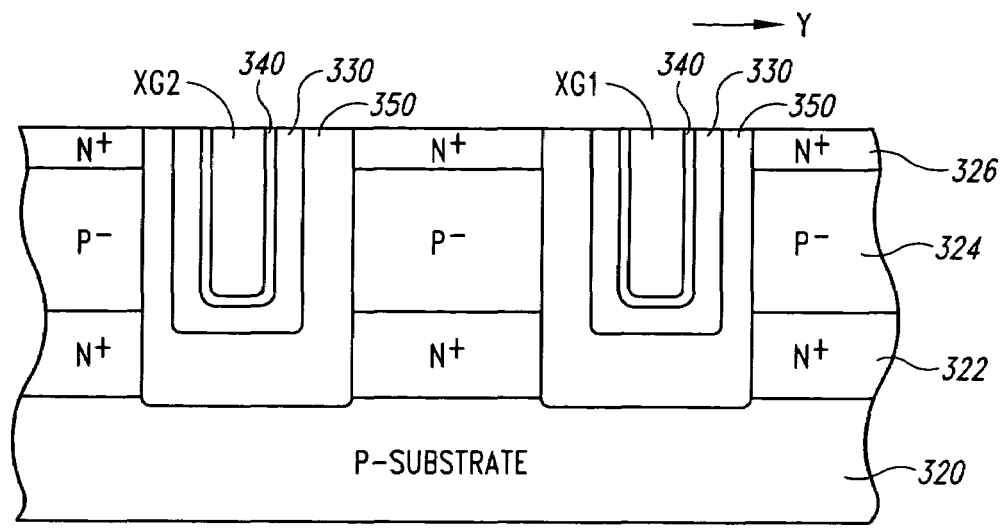
FIG. 16 is a partial cross sectional view that illustrates a step in a method for forming a memory array according to another embodiment of the invention.

FIG. 15 is a partial plan view that illustrates the formation of a plurality of substantially parallel grooves 520 that extend in the y-direction. The grooves 520 are formed by selectively etching the structure shown in FIG. 14, so that the polysilicon or metallic interconnections 530 extend across the grooves 520. The interconnections 530 form the gate lines XG1, XG2 . . . XGN as described in detail in connection with FIGS. 8–10. The polysilicon layer 520, the oxide layer 530 and the polysilicon or metal layer 540 may then be removed from the upper surfaces 540, as shown in greater detail in FIG. 16. The layers 520, 530 and 540 may be removed using chemical-mechanical planarization.

Figure 17:
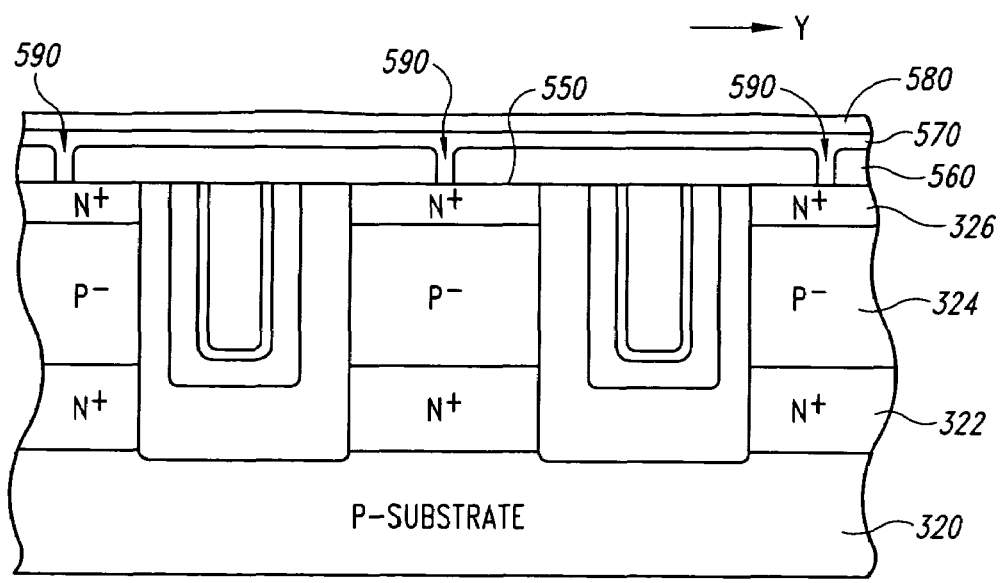
FIG. 17 is a partial cross sectional view that illustrates a step in a method for forming a memory array according to another embodiment of the invention.

Turning to FIG. 17, a surface oxide layer 550 may be deposited on a surface 550 and patterned using a photoresist (not shown) to form an etch-stop layer to form a plurality of protrusions 590 that extend through the surface oxide layer 550 to the second source/drain regions 326. A metal layer 570 is then deposited on the surface oxide layer 550 that extends downwardly into each of the protrusions 590 to electrically couple the second source/drain regions 326, forming the data lines YD1, YD2 . . . YDN described in detail in connection with FIGS. 8–10.

From the foregoing it will be appreciated that, although specific embodiments of the invention have been described herein for purposes of illustration, various modifications may be made without deviating from the spirit and scope of the invention. For example, certain features shown in the context of one embodiment of the invention may be incorporated into other embodiments as well. Accordingly, the invention is not limited by the foregoing description of embodiments except as by the following claims.

The invention claimed is:

1. A computer system, comprising:
   a central processing unit (CPU); and
   at least one memory device coupled to the processor, the memory device including an array having memory cells arranged in rows and columns for storing a desired logic state, each cell including a first columnar structure having two first source/drain regions and a spaced apart second columnar structure having two second source/drain regions with a floating gate structure interposed between the first columnar structure and the second columnar structure and spaced apart from the first and second structures, the floating gate being positioned closer to a selected one of the first and second columnar structures.

2. The computer system of claim 1, wherein the memory device further comprises a gate line positioned within the floating gate structure and electrically isolated from the floating gate structure, and wherein one first source/drain region and one second source/drain region are electrically coupled between the first and second columnar structures.

3. The computer system of claim 2, wherein the first and the second source/drain regions comprise a semiconductor material having a first conductivity.

4. The computer system of claim 3, further comprising a separation layer of a semiconductor material interposed between the first and second source/drain regions, the layer having a second conductivity.

5. The computer system of claim 3, wherein the first and the second source/drain regions comprise silicon and the first conductivity is an N+ conductivity.

6. The computer system of claim 4, wherein the separation layer comprises silicon and the second conductivity is a P– conductivity.

7. The computer system of claim 2, wherein the memory device further comprises a decoder coupled to each of the first source/drain region, the second source/drain region and the gate line.

8. The computer system of claim 7, further comprising an address buffer coupled to the decoders.

9. The computer system of claim 1, further comprising an address bus, a data bus and a control bus that couples the CPU to the at least one memory device.

10. The computer system of claim 9, further comprising a system controller coupled to the address bus, the data bus and the control bus.

11. The computer system of claim 10, further comprising at least one of a keyboard, a mouse, a display device and a modem coupled to the input/output module.

12. The computer system of claim 9, further comprising an external secondary mass storage device.

13. A semiconductor memory device, comprising:
an array having memory cells for storing a desired logic state, each cell further comprising first and second adjacent field effect transistors (FETs) having respective source/drain regions and a common floating gate structure that is spaced apart from the source/drain regions of the first FET by a first distance, and spaced apart from the source/drain regions of the second FET by a second distance, wherein the first distance is less than the second distance and where the first and second FETs are each formed on a substrate material of a first conductivity type and have source/drain regions that are formed of material of a second conductivity type.

14. A semiconductor memory device, comprising:
an array having memory cells for storing a desired logic state, each cell further comprising first and second adjacent field effect transistors (FETs) having respective source/drain regions and a common floating gate structure that is spaced apart from the source/drain regions of the first FET by a first distance, and spaced apart from the source/drain regions of the second FET by a second distance, wherein the first distance is less than the second distance and where the first and second FETs are each formed on a substrate material of a first conductivity type and have source/drain regions that are formed of material of a second conductivity type;
wherein each of the respective source/drain regions further comprise a first source/drain region and a spaced apart second drain region configured in a columnar structure extending upwardly from an underlying substrate, and further wherein a separation layer is interposed between the first source/drain region and the second drain region.

15. A semiconductor memory device, comprising:
an array having memory cells for storing a desired logic state, each cell further comprising first and second adjacent field effect transistors (FETs) having respective source/drain regions and a common floating gate structure that is spaced apart from the source/drain regions of the first FET by a first distance, and spaced apart from the source/drain regions of the second FET by a second distance, wherein the first distance is less than the second distance;
wherein each of the respective source/drain regions further comprise a first source/drain region and a spaced apart second drain region configured in a columnar structure extending upwardly from an underlying substrate, and further wherein a separation layer is interposed between the first source/drain region and the second drain region; and
wherein the first source/drain region and the second drain region are comprised of a semiconductor material having an N+ conductivity, and further wherein the separation layer is comprised of a semiconductor material having a P– conductivity.

16. The semiconductor memory device of claim 13, wherein the common floating gate structure is comprised of polysilicon.

17. The semiconductor memory device of claim 13, wherein the second distance is approximately about two times the first distance.

18. The semiconductor memory device of claim 13, wherein the first distance is approximately about 30 Å.

19. A semiconductor memory device, comprising:
an array having memory cells for storing a desired logic state, each cell further comprising first and second adjacent field effect transistors (FETs) having respective source/drain regions and a common floating gate structure that is spaced apart from the source/drain regions of the first FET by a first distance, and spaced apart from the source/drain regions of the second FET by a second distance, wherein the first distance is less than the second distance;
wherein the array further comprises a drain line extending in a first direction and coupling the second source/drain regions of the first and second FETs, and further wherein the first source/drain region of the first and second FETs extend in a second direction that is perpendicular to the first direction.

20. The semiconductor memory device of claim 19, wherein the array further comprises a gate line that extends in the second direction.

21. The semiconductor memory device of claim 20, further comprising a decoder coupled to each of the drain line, the first source/drain region and the gate line.

22. A method of forming a memory device having a plurality of interconnected memory cells, each cell comprising:
positioning a first columnar structure on a substrate having at least two source/drain regions formed in it;
positioning a second columnar structure on the substrate having at least two source/drain regions formed in it, wherein the second columnar structure is spaced apart from the first columnar structure;
forming a gate structure between the first structure and the second structure; and
interposing a floating gate structure between the first structure and the gate structure and between the second structure and the gate structure, the floating gate structure being positioned closer to selected one of the first structure and the second structure.

23. The method of claim 22, wherein positioning a first and second columnar structures on the substrate further comprises:
    forming a first source/drain region having a first conductivity on the substrate;
    forming a second source/drain region proximate to the first source/drain region, the second source/drain region having the first conductivity; and
    interposing a separation layer between the first source/drain region and the second source/drain region.

24. The method of claim 23, wherein forming a first source/drain region having a first conductivity comprises forming a source/drain region having an N+ conductivity.

25. The method of claim 23, wherein interposing a separation layer between the first source/drain region and the second source/drain region comprises forming a layer between the first source/drain region and the second source/drain region having a second conductivity.

26. The method of claim 25, wherein forming a layer between the first source/drain region and the second source/drain region having a second conductivity comprises forming a layer that is doped to a P– conductivity between the first source/drain region and the second source/drain region.

27. The method of claim 23, further comprising coupling the second source/drain region of the first columnar structure and the second source/drain region of the second columnar structure with a drain line.

28. The method of claim 22, wherein interposing a floating gate structure between the first structure and the gate structure and between the second structure and the gate structure further comprises positioning an insulating layer between the floating gate structure and the first and second columnar structures.

29. The method of claim 28, wherein positioning an insulating layer between the floating gate structure and the first and second columnar structures comprises forming a first insulating layer between the first structure and the floating gate structure having a first thickness and forming a second insulating layer between the second structure and the floating gate structure having a second thickness, the first thickness being less than the second thickness.

30. A method of forming a memory device having a plurality of interconnected memory cells, each cell comprising:
    positioning a first columnar structure on a substrate;
    positioning a second columnar structure on the substrate that is spaced apart from the first columnar structure;
    forming a gate structure between the first structure and the second structure; and
    interposing a floating gate structure between the first structure and the gate structure and between the second structure and the gate structure, the floating gate structure being positioned closer to selected one of the first structure and the second structure;
    wherein positioning a first and second columnar structures on the substrate further comprises positioning the first and second columnar structures on a silicon substrate that is doped to have a first conductivity.

31. The method of claim 30, wherein positioning the first and second columnar structures on a silicon substrate that is doped to have a first conductivity includes doping the substrate to have a P conductivity.

32. A method of forming a memory device having a plurality of interconnected memory cells, each cell comprising:
    positioning a first columnar structure and a second columnar structure on the substrate that is spaced apart from the first columnar structure, wherein positioning a first and second columnar structures on the substrate further comprises,
        forming a first source/drain region having a first conductivity on the substrate,
        forming a second source/drain region proximate to the first source/drain region, the second source/drain region having the first conductivity, and
        interposing a separation layer between the first source/drain region and the second source/drain region;
    forming a gate structure between the first structure and the second structure; and
    interposing a floating gate structure between the first structure and the gate structure and between the second structure and the gate structure, the floating gate structure being positioned closer to selected one of the first structure and the second structure;
    wherein forming a second source/drain region proximate to the first source/drain region comprises forming a source/drain region having an N+ conductivity above the first source/drain region.

* * * * *

UNITED STATES PATENT AND TRADEMARK OFFICE
CERTIFICATE OF CORRECTION

PATENT NO.        : 7,095,075 B2                                       Page 1 of 1
APPLICATION NO. : 10/612725
DATED             : August 22, 2006
INVENTOR(S)       : Leonard Forbes It is certified that error appears in the above-identified patent and that said Letters Patent is hereby corrected as shown below:

Column 2, line 19, please insert --than-- after "lower"

Signed and Sealed this

Fifth Day of December, 2006

JON W. DUDAS
*Director of the United States Patent and Trademark Office*